(12) United States Patent
Kim et al.

(10) Patent No.: US 12,272,792 B2
(45) Date of Patent: Apr. 8, 2025

(54) METHOD FOR MANUFACTURING SECONDARY BATTERY

(71) Applicant: LG ENERGY SOLUTION, LTD., Seoul (KR)

(72) Inventors: Sung Tae Kim, Daejeon (KR); Nak Gi Sung, Daejeon (KR); Joon Sup Kang, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 769 days.

(21) Appl. No.: 17/419,090

(22) PCT Filed: Apr. 6, 2020

(86) PCT No.: PCT/KR2020/004616
§ 371 (c)(1),
(2) Date: Jun. 28, 2021

(87) PCT Pub. No.: WO2020/226285
PCT Pub. Date: Nov. 12, 2020

(65) Prior Publication Data
US 2022/0077491 A1  Mar. 10, 2022

(30) Foreign Application Priority Data

May 9, 2019  (KR) .................. 10-2019-0054063

(51) Int. Cl.
*H01M 6/00* (2006.01)
*G01R 31/385* (2019.01)
(Continued)

(52) U.S. Cl.
CPC ...... *H01M 10/058* (2013.01); *G01R 31/3865* (2019.01); *G01R 31/388* (2019.01);
(Continued)

(58) Field of Classification Search
CPC .......... G01R 31/3865; G01R 31/388; G01R 31/392; H01M 4/043; H01M 4/0447;
(Continued)

(56) References Cited

U.S. PATENT DOCUMENTS 9,880,225 B2 * 1/2018 Koba ............... G01R 31/36
9,960,452 B2   5/2018 Ueno et al.
(Continued)

FOREIGN PATENT DOCUMENTS

CN   106164690 A   11/2016
CN   106997960 A   8/2017
(Continued)

OTHER PUBLICATIONS

International Search Report for PCT/KR2020/004616 mailed on Jul. 10, 2020.
(Continued)

*Primary Examiner* — Paul D Kim
(74) *Attorney, Agent, or Firm* — Birch, Stewart, Kolasch & Birch, LLP (57) ABSTRACT

A method for manufacturing a secondary battery includes a formation step for charging an assembled secondary battery to a state of charge (SOC) of 45% to 65%; an aging step for aging the secondary battery for which the formation has been completed; and a low voltage testing step for measuring the change in voltage value, wherein, in the low voltage testing step, a voltage value is measured in an SOC interval of 30% or lower. Since an SEI coating is stably formed in the method for manufacturing a secondary battery, charging time is shortened and thus the secondary battery can be mass-produced. In addition, since a low voltage test is performed in an interval in which the voltage change rate per capacity of a negative electrode is high, a low voltage defect due to non-uniformity of the formation process can be
(Continued)

detected in the method for manufacturing the secondary battery.

11 Claims, 5 Drawing Sheets

(51) Int. Cl.
    *G01R 31/388*     (2019.01)
    *H01M 4/04*     (2006.01)
    *H01M 10/0525*     (2010.01)
    *H01M 10/058*     (2010.01)
    *H01M 10/44*     (2006.01)

(52) U.S. Cl.
    CPC ......... *H01M 4/043* (2013.01); *H01M 4/0447* (2013.01); *H01M 10/0525* (2013.01); *H01M 10/446* (2013.01)

(58) Field of Classification Search
    CPC ........... H01M 10/052; H01M 10/0525; H01M 10/058; H01M 10/446
    See application file for complete search history.

(56) References Cited

U.S. PATENT DOCUMENTS

| | | | |
|---|---|---|---|
| 2016/0261006 A1 | 9/2016 | Ueno et al. | |
| 2016/0268648 A1 | 9/2016 | Ueno et al. | |
| 2018/0164384 A1 | 6/2018 | Kwon et al. | |
| 2019/0033380 A1* | 1/2019 | Kim | H01M 10/0525 |
| 2021/0135304 A1* | 5/2021 | Lee | H01M 10/446 |
| 2021/0181259 A1* | 6/2021 | Park | H02J 7/0048 |
| 2022/0043068 A1* | 2/2022 | Lee | G01R 31/3842 |

FOREIGN PATENT DOCUMENTS

| | | | |
|---|---|---|---|
| CN | 107528093 A | | 12/2017 |
| CN | 108780127 A | | 11/2018 |
| CN | 109244573 A | | 2/2025 |
| EP | 2 860 539 A1 | | 4/2015 |
| EP | 3 415 938 A1 | | 12/2018 |
| EP | 3428670 A1 | | 1/2019 |
| JP | 2014-6205 A | | 1/2014 |
| JP | 2014-134395 A | | 7/2014 |
| JP | 2014-238961 A | | 12/2014 |
| JP | 2015-95332 A | | 5/2015 |
| JP | 2015-95333 A | | 5/2015 |
| JP | 2015-95334 A | | 5/2015 |
| JP | 2016-40756 A | | 3/2016 |
| JP | 2016110777 A | * | 6/2016 |
| JP | 6007980 B2 | | 10/2016 |
| JP | 2017106867 A | * | 6/2017 |
| JP | 2018-28967 A | | 2/2018 |
| KR | 10-1106359 B1 | | 1/2012 |
| KR | 10-2012-0073744 A | | 7/2012 |
| KR | 10-2013-0126365 A | | 11/2013 |
| KR | 10-2014-0005799 A | | 1/2014 |
| KR | 10-2015-0015303 A | | 2/2015 |
| KR | 10-2015-0049526 A | | 5/2015 |
| KR | 10-2015-0144558 A | | 12/2015 |
| KR | 10-2016-0038593 A | | 4/2016 |
| KR | 10-2016-0047157 A | | 5/2016 |
| KR | 10-2016-0065967 A | | 6/2016 |
| KR | 10-1709553 B1 | | 2/2017 |
| KR | 10-2017-0101582 A | | 9/2017 |
| KR | 10-2018-0068708 A | | 6/2018 |
| KR | 10-2018-0071798 A | | 6/2018 |
| KR | 10-2018-0080914 A | | 7/2018 |
| KR | 10-2018-0081009 A | | 7/2018 |
| KR | 10-2018-0090744 A | | 8/2018 |
| WO | WO 2013/157128 A1 | | 10/2013 |

OTHER PUBLICATIONS

Japanese Office Action dated Aug. 16, 2022 for Application No. 2021-534897 with an English translation.
Extended European Search Report for European Application No. 20802035.4, dated Feb. 9, 2022.
European Communication pursuant to Article 94(3) EPC for European Application No. 20 802 035.4, dated Jul. 4, 2024.
Korean Office Action dated Dec. 6, 2023 for Application No. 10-2019-0054063 with an English translation.

* cited by examiner

METHOD FOR MANUFACTURING SECONDARY BATTERY

TECHNICAL FIELD

This application claims the benefit of priority based on Korean Patent Application No. 10-2019-0054063, filed on May 9, 2019, and the entire contents of the Korean patent application are incorporated herein by reference.

The present invention relates to a method for manufacturing a secondary battery, and more particularly, to a method for manufacturing a secondary battery, capable of shortening the charging time to ensure mass production of secondary batteries, reducing the variation in the performance of the manufactured secondary battery and facilitating the detection of low-voltage defects, detecting low-voltage defects caused by foreign materials or internal short circuits and defects due to non-uniformity of formation conditions such as lithium plating, wetting, and gas, and shortening the detection time of low-voltage defects.

BACKGROUND ART

As technologies for mobile devices are developed and demand for the mobile devices increases, there has been a rapid increase in demand for secondary batteries as energy sources. Among such secondary batteries, lithium secondary batteries, which exhibit a high energy density and operational potential, a long cycle life, and a low self-discharge rate have been commercialized and widely used.

The lithium secondary battery undergoes an activation process after the electrode assembly is assembled in the battery case together with the electrolyte. The activation process stabilizes the battery structure and makes it usable through charging, aging, and discharging the assembled battery.

In the lithium secondary battery, various types of defects may occur due to various causes during a manufacturing process or use. In particular, some of secondary batteries that have been manufactured have a phenomenon of exhibiting a voltage drop behavior over a self-discharge rate, and this phenomenon is called low voltage.

The low voltage failure phenomenon of the secondary battery is often due to a foreign metal material located therein. In particular, when a metal foreign material such as iron or copper is present in the positive electrode plate of the secondary battery, the metal foreign material may grow as a dendrite at the negative electrode. In addition, such a dendrite causes an internal short circuit of the secondary battery, which may cause failure or damage of the secondary battery or, in severe cases, ignition.

Conventionally, the pre-aged battery is first charged in the range of 10% to 30% SOC, and the OCV (Open Circuit Voltage) is measured at two selected time points during the aging process. Then the change value (voltage drop amount) of OCV is compared with a reference value, and a secondary battery having a voltage drop amount below the reference value is determined as a good product. In this way, low voltage defects have been detected.

However, the method described above has a region in which the voltage drop amount of a good product and the voltage drop amount of a bad product appear at the same level, so it is difficult to accurately select a low voltage defect. In addition, the conventional method has a disadvantage in that it is not possible to sort out defects due to non-uniformity of formation states such as lithium plating and gas. Therefore, there is a need for an activation method that reduces the amount of voltage drop of a good product and detects a low voltage defect due to formation non-uniformity.

DISCLOSURE

Technical Problem

The present invention is proposed to solve the above problems, and an object of the present invention is to provide a method of activating a secondary battery that improves dispersion by reducing a voltage drop amount of a good product and increases a detection power of a low voltage defect.

In addition, another object of the present invention is to provide a method of manufacturing a secondary battery that secures mass productivity by shortening a charging time and a detection time of a low voltage defect.

In addition, another object of the present invention is to provide a method for detecting a defect due to a non-uniformity of formation as well as a low voltage defect caused by foreign materials.

Technical Solution

The method for manufacturing a secondary battery of the present invention includes: a formation step of charging an assembled secondary battery to state of charge (SOC) 45% to 65% to provide a formed secondary battery; an aging step of aging the formed secondary battery; and a low voltage test step of measuring a change in a voltage value, wherein in the low voltage test step, the voltage value is measured in a section of SOC 30% or less.

In one embodiment of the present invention, in the formation step, charging and pressurizing of the assembled secondary battery may be simultaneously performed.

At this time, the formation step may be performed at a temperature of 30° C. to 65° C.

In one embodiment of the present invention, the formation step may include an initial section, a middle section, and a last section according to SOC, and formation conditions of charging speed or pressing force for each section are different.

At this time, the formation for the secondary battery may be performed at the charge rate of 0.1C to 0.3C and the pressure of 0.1 kgf/cm$^2$ to 1.0 kgf/cm$^2$ in the initial section, at the charge rate of 0.7C to 1.3C and the pressure of 0.1 kgf/cm$^2$ to 1.0 kgf/cm$^2$ in the middle section, and at the charge rate of 0.7C to 1.3C and the pressure of 7 kgf/cm$^2$ to 13 kgf/cm$^2$ in the last section.

Further, an upper limit of the initial section may be SOC 1% to 7%, and an upper limit of the middle section may be SOC 15% to 19%.

In one embodiment of the present invention, in the aging step, the secondary battery may be stabilized at a temperature above 60° C.

In one embodiment of the present invention, the method may further include a room temperature aging step of stabilizing the secondary battery at a temperature of 20° C. to 30° C.

In one embodiment of the present invention, the method may further include: a step of degassing after the aging step; and a full charge and full discharge step.

In one embodiment of the present invention, the method may further include a shipping charge step after the full charge and full discharge step.

In one embodiment of the present invention, the method may further include a pre-aging step of aging the assembled secondary battery at room temperature, before the formation step.

In one embodiment of the present invention, the low voltage test step may include sorting out a defective secondary battery from a voltage drop amount.

In one embodiment of the present invention, the low voltage test step may be performed in a section of SOC 10% to 30%.

The present invention provides a lithium secondary battery manufactured by the above method.

Advantageous Effects

The method for manufacturing a secondary battery of the present invention shows an effect of reducing a voltage drop amount of a good product, increasing a voltage drop amount of a defective product, and thereby improving a low voltage defect detection power to shorten the time required for low voltage inspection.

In addition, according to the method for manufacturing a secondary battery of the present invention, since the SEI film is stably formed, the time required for charging is shortened, and thus, the mass productivity of the secondary battery is secured.

In addition, according to the method for manufacturing a secondary battery of the present invention, since a low voltage test is performed in a section where the rate of voltage change per capacity of the negative electrode is large, there is an effect of detecting a low voltage defect due to non-uniformity of the formation process.

DETAILED DESCRIPTION OF THE PREFERRED EMBODIMENTS

Hereinafter, preferred embodiments of the present invention will be described in detail with reference to the accompanying drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

Figure 2:
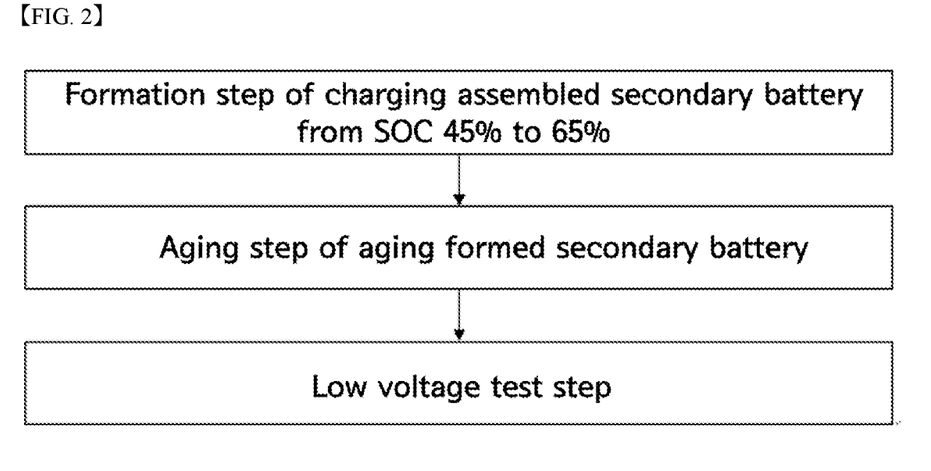
FIG. 2 is a view showing a sequence of a secondary battery manufacturing method according to an embodiment of the present invention.

FIG. 2 shows a sequence of a secondary battery manufacturing method according to an embodiment of the present invention. Referring to FIG. 2, the method for manufacturing a secondary battery according to an embodiment of the present invention includes: a formation step of charging the assembled secondary battery from SOC 45% to 65%; an aging step of aging the formed secondary battery; and a low voltage test step to measure the change in voltage value, in which in the low voltage test step, the voltage value is measured in a section of SOC 30% or less.

The formation step is a step of forming a coating layer of SEI (solid electrolyte interface) of the negative electrode and is characterized in that the assembled secondary battery is charged at a high rate of 45% to 65% of the capacity of the secondary battery (SOC).

In order to improve the dispersion by reducing the voltage drop of a good quality secondary battery, the SEI film of the negative electrode should be formed uniformly and stably, which can be achieved only when the volume of the negative electrode is expanded to the maximum. The inventors of the present invention found that the SEI film is formed as uniformly as possible when the charge is performed at SOC 45% to 65% during the primary charging, and the voltage drop amount of the good product is reduced, which has led the inventors to the present invention.

Figure 1:
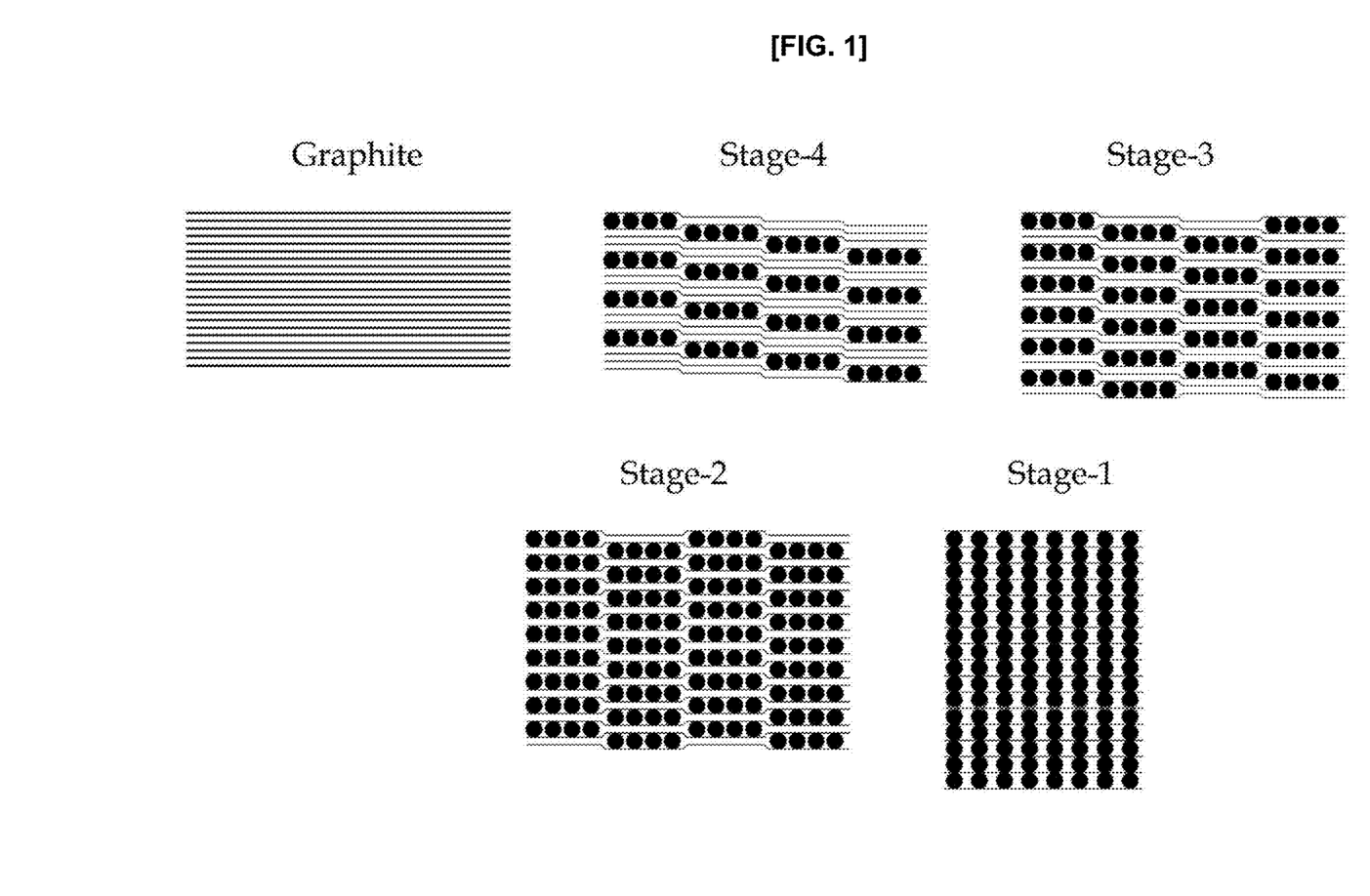
FIG. 1 is a schematic view showing a step in which lithium ions are inserted into a negative electrode active material through charging.

FIG. 1 is a schematic view showing a step in which lithium ions are inserted into a negative electrode active material through charging. Referring to FIG. 1, as charging proceeds, lithium ions are inserted into the layered structure of the negative electrode, stabilizing from stage 4 to stage 1. In the primary charging step, a stable SEI layer may be formed only when charging is performed until the stage 2 is completed. Here, the charge point at which stage 2 is completed is different depending on the type of the negative electrode active material, but is generally at a level of SOC 45% to SOC 65%. In the prior art, during the primary charging of the activation process, it was charged to a point at which SOC becomes 30%. This is a section converted from stage 3 to stage 2, and the charging is terminated when the negative electrode volume is not sufficiently expanded. As such, the SEI film was not formed stably.

Therefore, during the primary charging of the formation process, if the charging is perform at less than 45% of SOC, it may be difficult to achieve the object of the present invention, which is not preferable.

The charging conditions of the formation step may be performed according to a method known in the art. Specifically, charging may be performed with a charging voltage of 3.0 to 4.0V and a C-rate of 1.3C or less. However, the charging voltage and the charging speed may vary according to the type or characteristics of the secondary battery, but are not limited thereto.

In one preferred embodiment of the present invention, in order to prevent a gas trap phenomenon and lithium plating in which gas generated during charging of the formation process is trapped between the electrode and the separator, it is preferable that the secondary battery is pressurized at the same time as charging in the formation step.

As described above, by pressurizing the secondary battery in the formation step, the SEI film is uniformly formed on the negative electrode, which has the advantage of maximizing the performance of the battery, such as capacity and resistance, and has the effect of shortening the charging and discharging time. The pressing may be performed using a jig or the like, but is not limited if it is a means capable of pressing the secondary battery.

In one embodiment of the invention, the formation step is preferably carried out at a temperature of 30° C. to 65° C.

In one embodiment of the present invention, the formation step may include three initial, middle, and last stage formation sections according to SOC, and the formation conditions of the charging speed or the pressing force for each section may be set to be different.

Specifically, the formation for the secondary battery is performed at the charge rate of 0.1C to 0.3C and the pressure of 0.1 kgf/cm$^2$ to 1.0 kgf/cm$^2$ in the initial section, at the charge rate of 0.7C to 1.3C and the pressure of 0.1 kgf/cm$^2$ to 1.0 kgf/cm$^2$ in the middle section, and at the charge rate of 0.7C to 1.3C and the pressure of 7 kgf/cm$^2$ to 13 kgf/cm$^2$ in the last section.

Herein, the initial section may mean the formation section of from SOC 0% to a point between SOC 1% to SOC 7%, the middle section may mean the formation section of from a point after the initial section to a point between SOC 15% to SOC 19%, and the last section may mean the formation section of from a point after the middle section to a point between SOC 45% to SOC 65%.

In this way, the formation section is set in multiple stages, and the charging speed and the pressing force are set differently for each formation section for formation, thereby improving the capacity and resistance performance of the secondary battery and reducing the performance variation of the good product, which shows an effect of improving the detection power of the defective battery.

Thereafter, an aging step of stabilizing the formed secondary battery is performed. The aging step is a step of further stabilizing the battery by maintaining at a constant temperature and humidity.

The aging step may include a high temperature aging step for aging in a high temperature environment of 60° C. or higher and/or a normal temperature aging step for stabilizing a secondary battery at a temperature of 20° C. to 30° C.

The high temperature aging step is a step of stabilizing the SEI film formed in the formation step above, which has an advantage that when the formed battery is aged at a high temperature rather than room temperature, the stabilization of the SEI film is further accelerated. For the purpose of the present invention to reduce the SEI film to reduce the performance variation of the secondary battery, it is preferable to perform high temperature aging after the formation process.

In the present invention, the high-temperature aging step is performed at 60° C. or higher, preferably 65° C. to 75° C., thereby accelerating stabilization of the SEI film of good products and reducing the amount of self-discharge of good products to improve low voltage detection. When the high temperature aging is performed at a temperature of less than 60° C., it is difficult to achieve the object of the present invention, and when the temperature is too high, there is a problem that battery performance, such as capacity and life, is deteriorated, which is not desirable.

In one embodiment of the present invention, the high-temperature aging step may be performed for 18 hours to 36 hours, more preferably 21 hours to 24 hours. If the high temperature aging time is less than 18 hours, the stabilization of the SEI film may not be sufficient to achieve the object of the present invention, and when the high temperature aging time exceeds 36 hours, the aging time is prolonged, which is undesirable in terms of productivity.

The secondary battery in which the SEI film is stabilized by a high temperature aging can be subjected to room temperature aging to be stabilized at a room temperature. The room temperature aging step may be performed at 20° C. to 30° C., specifically 22° C. to 28° C., more specifically 23° C. to 27° C., and even more specifically 25° C. to 27° C.

In one embodiment of the present invention, at the same time as the room temperature aging process or after the end of the room temperature aging process, a process of inspecting whether an electrolyte is impregnated, whether a side reaction occurs, and whether assembly parts are abnormal may be performed. In the test, the OCV of the secondary battery is measured at the starting point at which room temperature aging starts, and the OCV is measured at the end point at which room temperature aging is completed to confirm the change in the voltage value. And if the difference between the voltage values exceeds a preset reference value, the produced battery may be determined as defective.

Figure 3:
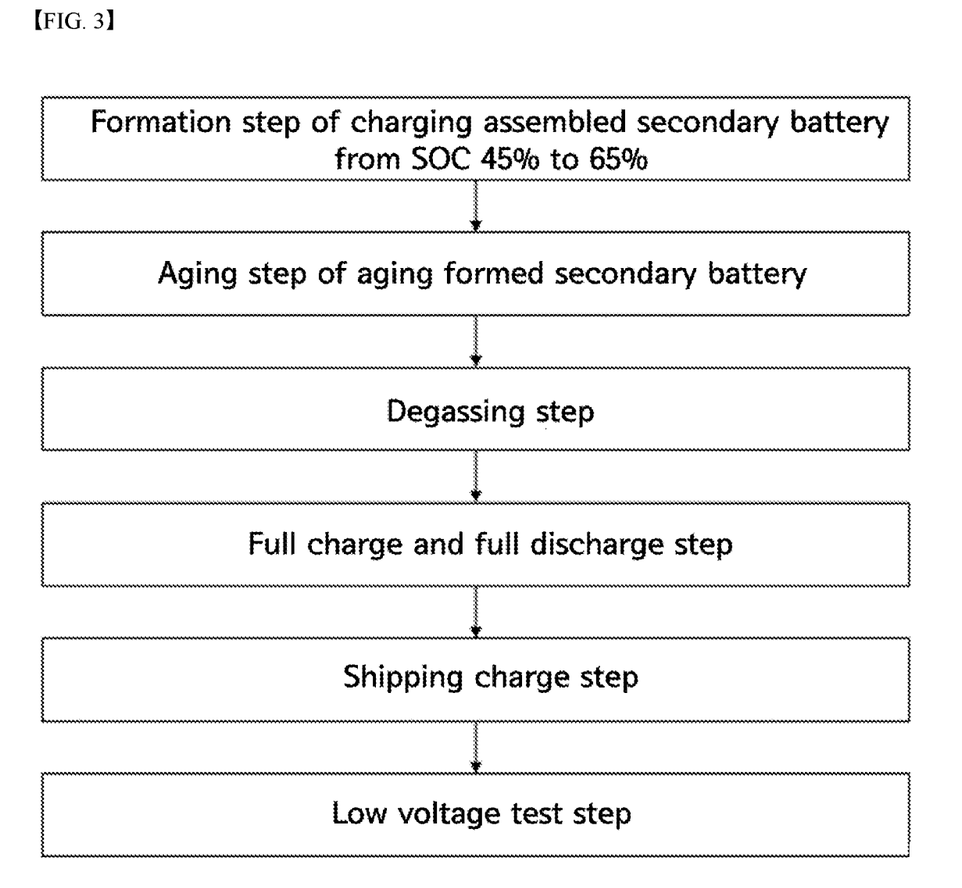
FIG. 3 is a view showing a sequence of a secondary battery manufacturing method according to another embodiment of the present invention.

FIG. 3 is a flowchart illustrating a method of manufacturing a secondary battery according to an embodiment of the present invention. Referring to FIG. 3, after the aging step, the method of manufacturing a secondary battery includes: a step of performing a degassing process; a step of performing full charge and full discharge processes; a step of performing a shipping charge; and a step of measuring the change in voltage value.

The degassing process is for removing side reaction gases generated inside the secondary battery while going through the formation process and the aging step. In the degassing process, various degassing techniques known at the time of filing the present invention can be employed. For example, the degassing process may be performed by cutting an extended portion and sealing the cut portion in a pouch-type secondary battery having one side extended. However, since such a degassing technique is widely known to those skilled in the art, a more detailed description is omitted here.

The full charge and full discharge process is a process of completely charging and completely discharging the battery in order to activate the battery and sort out defective batteries. The shipping charge step is a step of charging the battery for shipping after the product is completely discharged.

The secondary battery whose shipping charge has been completed detects a low voltage defect through a step of measuring a change in the voltage value. The step of measuring the change in the voltage value includes stabilizing the shipping-charged battery under constant temperature and humidity conditions and measuring the voltage (OCV). Specifically, the OCV of the battery is measured at the starting point of the stabilization of the battery that has been shipping-charged. Thereafter, the OCV of the battery is measured at a time point after 12 hours to 300 hours, 24 hours to 240 hours, or 36 hours to 120 hours from the starting point, and the change in the voltage value is checked. If the difference between the voltage values exceeds a preset reference value, the produced battery may be determined as defective.

Figure 4:
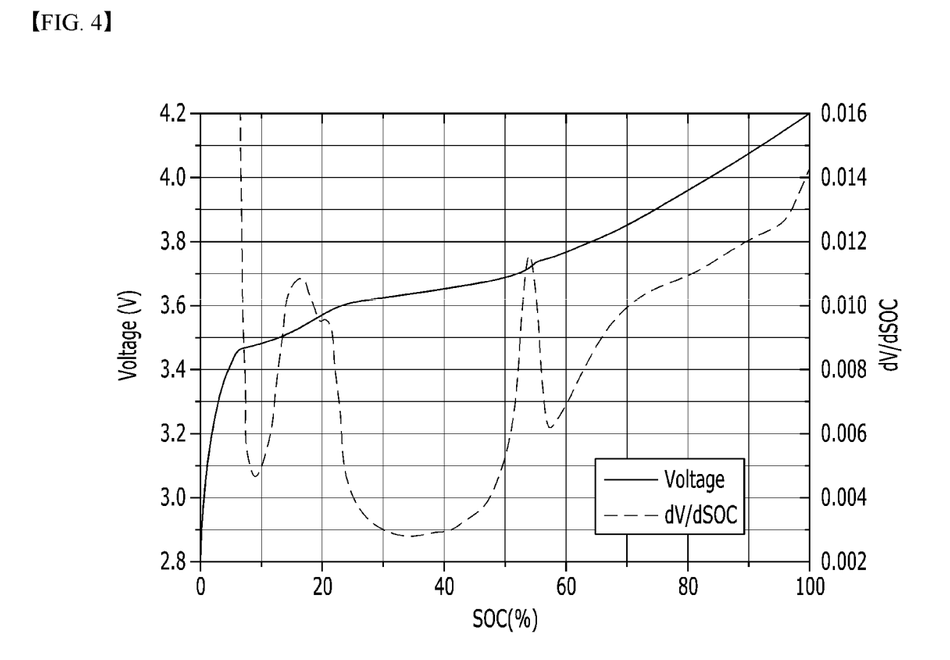
FIG. 4 is a graph showing voltage and dV/dSOC according to SOC of a battery.

FIG. 4 shows voltage and dV/dSOC according to SOC of a battery. Referring to this, the point having SOC 17% and SOC 54% has the largest dV/dSOC. When performing a low voltage test by measuring the voltage drop in the SOC section where the dV/dSOC is large as described above, since the self-discharge amount of the defective product is much larger than that of the good product, the detection power of the defective product is improved. However, performing the low voltage test by simply setting the low voltage test section as a section, in which the dV/dSOC or dV/dQ of the battery is large, is not sufficient to detect a low voltage defective cell in which the negative electrode film state is uneven due to poor formation. This is because even if the dV/dSOC or dV/dQ is a large section, a battery with poor formation may not be detected.

Accordingly, the present invention is characterized in that a low voltage test is performed by measuring the voltage drop in a section where the dV/dSOC of the negative electrode is large. In the case of a battery with an uneven negative electrode film condition due to poor formation such as lithium electrode plating, insufficient electrolyte impregnation, gas trap, etc., the self-discharge amount becomes large, thereby improving the detection sensitivity of defective products.

Figure 5:
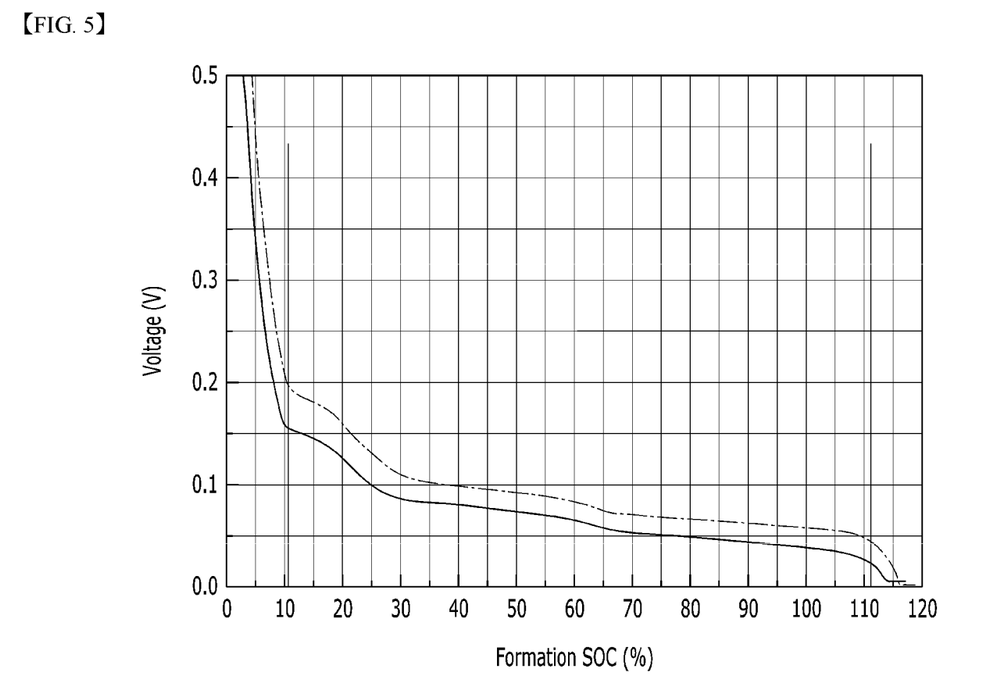
FIG. 5 is a graph showing voltage according to SOC of the negative electrode.

FIG. 5 shows the voltage according to the SOC of the negative electrode. Referring to this, since dV/dSOC (slope of the graph) is large in a section with SOC of 30% or less, it is easy to detect a formation-defective battery when performing a low voltage test in the SOC section. In terms of improving detection power, it is more preferable to perform a low voltage test in a section of SOC 5% to 25%. If there is a practical difficulty in setting the SOC to less than 10% SOC, the low voltage test may be performed in the SOC 10% to SOC 30% charge amount range, preferably SOC 10% to SOC 20% range.

In a method of manufacturing a secondary battery according to an embodiment of the present invention, before performing the formation process, a pre-aging step of aging the assembled secondary battery under constant temperature and humidity conditions may be performed.

First, in the pre-aging step, an electrode mixture including an electrode active material and a binder is applied to an electrode current collector to prepare a positive electrode and a negative electrode, respectively, and then an electrode assembly is prepared by interposing a separator between the positive electrode and the negative electrode.

After the electrode assembly thus prepared is accommodated in a battery case, an electrolyte is injected, and the battery case is sealed to manufacture a battery.

The step of manufacturing such a battery is not particularly limited and can be performed according to a known method.

In addition, the electrode assembly is not particularly limited as long as it is a structure including a positive electrode, a negative electrode, and a separator interposed between the positive electrode and the negative electrode, and may be, for example, a jelly-roll type, a stack type, or a stack/folding type.

The battery case is not particularly limited as long as it is used as an exterior material for packaging the battery, and a cylindrical, square, or pouch type may be used.

The electrolyte includes an organic solvent and a lithium salt, and may optionally further contain an additive.

The organic solvent is not limited as long as decomposition by an oxidation reaction or the like during charging and discharging of the battery can be minimized, and may be, for example, cyclic carbonate, linear carbonate, ester, ether, or ketone. These may be used alone, or two or more of them may be used in combination.

Among the organic solvents, carbonate-based organic solvents can be preferably used. Examples of cyclic carbonates include ethylene carbonate (EC), propylene carbonate (PC) and butylene carbonate (BC). Linear carbonates include dimethyl carbonate (DMC), diethyl carbonate (DEC), dipropyl carbonate (DPC), ethyl methyl carbonate (EMC), methylpropyl carbonate (MPC), and ethylpropyl carbonate (EPC).

Lithium salts commonly used in electrolytes of lithium secondary batteries such as $LiPF_6$, $LiAsF_6$, $LiCF_3SO_3$, $LiN(CF_3SO_2)_2$, $LiBF_4$, $LiBF_6$, $LiSbF_6$, $LiN(C_2F_5SO_2)_2$, $LiAlO_4$, $LiAlCl_4$, $LiSO_3CF_3$ and $LiClO_4$, etc. can be used for the lithium salt without limitation, and these can be used alone, two or more can be used in combination.

In addition, the electrolyte may optionally further include an additive. Any one or a mixture of two or more selected from a group consisting of vnylene carbonate, vinylethylene carbonate, fluoroethylene carbonate, cyclic sulfite, saturated sultone, unsaturated sultone, acyclic sulfone, lithium oxalyl difluoroborate (LiODFB), and derivatives thereof may be used as the additive in order to stably form an SEI film, but not limited thereto.

The cyclic sulfite may include ethylene sulfite, methyl ethylene sulfite, ethyl ethylene sulfite, 4,5-dimethyl ethylene sulfite, 4,5-diethyl ethylene sulfite, propylene sulfite, 4,5-dimethyl propylene sulfite, 4,5-diethyl propylene sulfite, 4,6-dimethyl propylene sulfite, 4,6-diethyl propylene sulfite, 1,3-butylene glycol sulfite, etc. Saturated sultone may include 1,3-propane sultone and 1,4-butane sultone, etc. Unsaturated sultone may include ethene sultone, 1,3-propene sultone, 1,4-butene sultone, and 1-methyl-1,3-propene sultone. The acyclic sulfone may include divinyl sulfone, dimethyl sulfone, diethyl sulfone, methylethyl sulfone, and methylvinyl sulfone.

These additives are added to the electrolyte to improve low temperature output characteristics by forming a solid SEI film on the negative electrode, as well as to suppress decomposition of the positive electrode surface and prevent oxidation reaction of the electrolyte during high temperature cycle operation.

When the battery case is of a pouch type, an aluminum laminated pouch including an aluminum layer may be used. After the electrolyte is injected, the opened portion of the aluminum laminated pouch can be sealed by heat welding.

In the pre-aging step, wetting of the battery by the electrolyte injected is performed.

More specifically, when the secondary battery is charged, if the electrons move to the negative electrode and charged, lithium ions are intercalated to the negative electrode to achieve charge neutrality. At this time, lithium ions can be occluded at the site where the electrolyte is impregnated, that is, where the ion migration path is maintained (wetting area), but occlusion is relatively difficult at the electrolyte non-wetting area.

Therefore, through the pre-aging step, the battery can be aged for 0.5 to 72 hours at room temperature and atmospheric pressure so that the electrolyte can be permeated into the positive and negative electrodes. For example, the pre-aging step may be performed at 20° C. to 30° C., specifically 22° C. to 28° C., more specifically 23° C. to 27° C., and even more specifically 25° C. to 27° C.

Hereinafter, the present invention will be described in detail with reference to examples. However, the embodiments according to the present invention may be modified into various other forms, and the scope of the present invention should not be construed as being limited to the examples described below. The examples of the present invention are provided to more fully describe the present invention to those skilled in the art.

Preparation Example 1

A positive electrode mixture was prepared by mixing 96.7 parts by weight of $Li[Ni_{0.6}Mn_{0.2}Co_{0.2}]O_2$ serving as a positive electrode active material, 1.3 parts by weight of graphite serving as a conductive material, and 2.0 parts by weight of polyvinylidene fluoride (PVdF) serving as a binder. The positive electrode mixture slurry was prepared by dispersing the obtained positive electrode mixture in 1-methyl-2-pyrrolidone functioning as a solvent. A positive electrode was prepared by coating, drying, and pressing the slurry on both sides of an aluminum foil having a thickness of 20 μm, respectively.

A negative electrode mixture was prepared by mixing 97.6 parts by weight of artificial graphite and natural graphite that function as negative electrode active materials (weight ratio: 90:10), 1.2 parts by weight of styrene-butadiene rubber (SBR) that functions as a binder, and 1.2 parts by weight of carboxymethyl cellulose (CMC). The negative electrode mixture slurry was prepared by dispersing the negative electrode mixture in ion-exchanged water functioning as a solvent. A negative electrode was prepared by coating, drying, and pressing the slurry on both sides of an copper foil having a thickness of 20 μm.

A non-aqueous electrolyte solution was prepared by dissolving $LiPF_6$ in an organic solvent, in which ethylene carbonate (EC), propylene carbonate (PC), and diethyl carbonate (DEC) were mixed in a composition of 3:3:4 (volume ratio). Herein, $LiPF_6$ was dissolved in the organic solvent to be a concentration of 1.0M.

The assembly of the lithium secondary battery was completed by laminating a porous polyethylene separator between the positive electrode and the negative electrode prepared above and storing them in a pouch, and then injecting the electrolyte.

Preparation Example 2

A lithium secondary battery was manufactured as in the above manufacturing example, but in the process of assembling a positive electrode, a negative electrode, and a separator, 100 μm of copper particles were added so that the micro short-circuit resistance became 1 k2 level, and the assembly of the defective battery was completed.

Example 1

10 assembled lithium secondary batteries of Preparation Example 1 were prepared, aged at room temperature of 25° C. for 24 hours, and pre-aged. Thereafter, the pre-aged secondary battery was mounted on a formation jig, and a jig formation process was then performed in which charging was performed at a temperature of 45° C. At this time, the formation process is divided into three stages according to SOC. For the initial section from SOC 0% to SOC 1%, the formation process was performed at the 0.2C charging rate and 0.5 $kgf/cm^2$ pressure. For the middle section from SOC 1% to SOC 17%, the formation process was performed at 1C charging rate and 0.5 $kgf/cm^2$ pressure. For the last section from SOC 17% to SOC 60%, the formation process was performed at 1C charging rate and 10 $kgf/cm^2$ pressure. Then, high temperature aging was performed at a temperature of 65° C. for 24 hours, and room temperature aging was performed at a normal temperature of 25° C. for 12 hours.

Subsequently, a degassing process was performed, and the degassed battery was fully charged and fully discharged, followed by shipping charge at SOC 17%.

Example 2

In Example 1, a lithium secondary battery was manufactured in the same manner as in Example 1, except that the terminal section was charged to 50% SOC during the formation process.

Example 3

In Example 1, a lithium secondary battery was manufactured in the same manner as in Example 1, except that the shipping charge was performed to the SOC 30% level.

Comparative Example 1

10 assembled lithium secondary batteries of Preparation Example 1 were prepared, aged at room temperature of 25° C. for 24 hours, and pre-aged. Thereafter, the pre-aged secondary battery was mounted on a formation jig, and a jig formation process was then performed in which charging was performed. At this time, the formation process is divided into three stages according to SOC. For the initial section from SOC 0% to SOC 5%, the formation process was performed at the 0.2C charging rate and 0.5 $kgf/cm^2$ pressure. For the middle section from SOC 5% to SOC 17%, the formation process was performed at 0.7C charging rate and 0.5 $kgf/cm^2$ pressure. For the last section from SOC 17% to SOC 30%, the formation process was performed at 0.7C charging rate and 10 $kgf/cm^2$ pressure. Then, high temperature aging was performed at a temperature of 65° C. for 24 hours, and room temperature aging was performed at a normal temperature of 25° C. for 12 hours.

Subsequently, a degassing process was performed, and the degassed battery was fully charged and fully discharged, followed by shipping charge at SOC 30%.

Reference Example 1

Ten batteries of the Preparation Example 2 were prepared, and a secondary battery was manufactured in the same manner as in Example 1.

Reference Example 2

Ten batteries of the Preparation Example 2 were prepared, and a secondary battery was manufactured in the same manner as in Example 3.

Reference Example 3

Ten batteries of the Preparation Example 2 were prepared, and a secondary battery was manufactured in the same manner as in Comparative example 1.

Experimental Example 1—Charging Time Measurement

In the manufacturing process of Examples 1 and 2 and Comparative Example 1, the charging time (primary charging time) and full charging time of the formation process were measured, respectively, and the average value was calculated, and the results are shown in Table 1.

TABLE 1

| | Primary charge time | Full charge time | Total charge time |
| --- | --- | --- | --- |
| Example 1 | 39.4 | 91 | 130.4 |
| Example 2 | 33.4 | 109 | 142.4 |
| Comparative Example 1 | 36.4 | 131 | 167.4 |

Referring to Table 1, in the first formation, the battery of Example 1 charged to a level of SOC 60% has a shorter charging time compared to the battery of Comparative Example 1 charged to a level of SOC 30%, thereby showing the effect of securing mass productivity.

Experimental Example 2

For each of the batteries of Example 1, OCV (OCV 1) was measured after each shipping charge was completed, from which OCV (OCV 2) was measured at each time point shown in Table 2. ΔOCV (=OCV1−OCV2) was calculated using the measured OCV1 and OCV2, and the maximum value of ΔOCV (the maximum value of ΔOCV of good products) was obtained.

For the batteries of Reference Example 1, OCV (OCV 1) was measured after each shipping charge was completed, from which OCV (OCV 2) was measured at each time point shown in Table 2. ΔOCV (=OCV1−OCV2) was calculated using the measured OCV1 and OCV2, and the minimum value of ΔOCV (the minimum value of ΔOCV of the defective product) was obtained.

And the value obtained by subtracting the ΔOCV maximum value of the good product from the ΔOCV minimum value of the defective product is shown in Table 2.

For the batteries of Example 3 and the batteries of Reference Example 2, a value obtained by subtracting the ΔOCV maximum value of the good product from the ΔOCV minimum value of the defective product in the same manner as above is shown in Table 2, and for the batteries of Comparative Example 1 and Reference Example 3, a value obtained by subtracting the maximum value of ΔOCV of the good product is shown in Table 2 in the same manner as above.

TABLE 2

| DAY | Minimum value of ΔOCV in Reference Example 1 - maximum value of ΔOCV in Example 1 (mV) | Minimum value of ΔOCV in Reference Example 2 - maximum value of ΔOCV in Example 3 (mV) | Minimum value of ΔOCV in Reference Example 3 - maximum value of ΔOCV in Comparative Example 1 (mV) |
|---|---|---|---|
| 1.5 | 0.2 | 0 | 0 |
| 2.5 | 0.4 | 0.2 | 0 |
| 3.0 | 0.5 | 0.3 | 0 |
| 3.5 | 0.6 | 0.4 | 0 |
| 4.0 | 0.8 | 0.4 | 0 |
| 4.5 | 1 | 0.5 | 0.1 |
| 5.5 | 1.2 | 0.6 | 0.2 |
| 6.5 | 1.5 | 0.9 | 0.2 |
| 7.5 | 1.8 | 1 | 0.3 |
| 13.5 | 3.5 | 1.8 | 0.7 |

Referring to Table 2, when the activation process and the low voltage test are performed by the method of Example 1, it can be seen that the voltage drop amount of the good product is reduced, and the voltage drop amount of the defective product is increased, so that the difference between the minimum value of the voltage drop amount of the good product and the maximum value of the voltage drop amount of the bad product becomes 0.8 mV on the fourth day.

On the other hand, when performing the activation process and the low voltage test in the method of Comparative Example 1, it can be seen that the difference between the minimum value of the voltage drop amount of a good product and the maximum value of the voltage drop amount of a defective product becomes 0.7 mV only after 13.5 days.

As described above, in the first formation, the method for manufacturing a secondary battery of the present invention, which increases the charging SOC and sets the low voltage test section to SOC 30% or less, shows an effect of clearly distinguishing good and bad products within a short time.

The invention claimed is:

1. A method for manufacturing a secondary battery, the method comprising:
    a formation step of charging an assembled secondary battery to state of charge (SOC) 45% to 65% to provide a formed secondary battery;
    an aging step of aging the formed secondary battery in the formation step to provide the secondary battery; and
    a low voltage test step of measuring a change in a voltage value of the secondary battery,
    wherein in the low voltage test step, the voltage value is measured in a section of SOC 30% or less, and
    wherein the formation step includes an initial section, a middle section, and a last section according to SOC, and formation conditions of charging speed or pressing force for each section are different.

2. The method of claim 1, wherein the formation is performed at a charge rate of 0.1C to 0.3C and a pressure of 0.1 kgf/cm² to 1.0 kgf/cm² in the initial section,
    wherein the formation is performed at a charge rate of 0.7C to 1.3C and a pressure of 0.1 kgf/cm² to 1.0 kgf/cm² in the middle section, and
    wherein the formation is performed at a charge rate of 0.7C to 1.3C and a pressure of 7 kgf/cm² to 13 kgf/cm² in the last section.

3. The method of claim 2, wherein an upper limit of the initial section is SOC 1% to 7%, and an upper limit of the middle section is SOC 15% to 19%.

4. The method of claim 1, wherein the step of measuring a change in the voltage value is performed in a section of SOC 5% to 25%.

5. A method for manufacturing a secondary battery, the method comprising:
    a formation step of charging an assembled secondary battery to state of charge (SOC) 45% to 65% to provide a formed secondary battery;
    an aging step of aging the formed secondary battery in the formation step to provide the secondary battery;
    a degassing step after the aging step;
    a full charge and full discharge step;
    a shipping charge step after the full charge and full discharge step; and
    a low voltage test step of measuring a change in a voltage value of the secondary battery,
    wherein in the low voltage test step, the voltage value is measured in a section of SOC 30% or less.

6. The method of claim 5, wherein, in the formation step, charging and pressurizing of the assembled secondary battery are simultaneously performed.

7. The method of claim 5, wherein the formation step is performed at a temperature of 30° C. to 65° C.

8. The method of claim 5, wherein the aging step comprises a high temperature aging step, in which the formed secondary battery is stabilized at a temperature above 60° C.

9. The method of claim 8, further comprising a room temperature aging step at a temperature of 20° C. to 30° C.

10. The method of claim 5, further comprising a pre-aging step of aging the assembled secondary battery at room temperature, before the formation step.

11. The method of claim 5, wherein the low voltage test step includes sorting out a defective secondary battery from a voltage drop amount.

\* \* \* \* \*